(12) United States Patent
Graff

(10) Patent No.: US 6,796,314 B1
(45) Date of Patent: Sep. 28, 2004

(54) USING HYDROGEN GAS IN A POST-ETCH RADIO FREQUENCY-PLASMA CONTACT CLEANING PROCESS

(75) Inventor: Wesley P. Graff, Austin, TX (US)

(73) Assignee: Novellus Systems, Inc., San Jose, CA (US)

( * ) Notice: Subject to any disclaimer, the term of this patent is extended or adjusted under 35 U.S.C. 154(b) by 159 days.

(21) Appl. No.: 09/949,326

(22) Filed: Sep. 7, 2001

(51) Int. Cl.[7] .............................................. B08B 7/00
(52) U.S. Cl. ........................... 134/1.2; 134/1; 134/1.3
(58) Field of Search ............................. 134/1, 1.1, 1.2, 134/1.3; 438/906; 216/67, 68, 69, 72, 74, 75, 77, 78, 79, 80

(56) References Cited

U.S. PATENT DOCUMENTS

| | | | |
|---|---|---|---|
| 6,372,657 B1 * | 4/2002 | Hineman et al. | 438/723 |
| 6,379,574 B1 * | 4/2002 | Ou-Yang et al. | 216/49 |
| 6,526,996 B1 * | 3/2003 | Chang et al. | 134/1.3 |
| 6,536,449 B1 * | 3/2003 | Ranft et al. | 134/1.1 |
| 2002/0045355 A1 * | 4/2002 | Chong et al. | 438/721 |

OTHER PUBLICATIONS

Grill Cold Plasma in Material Fabrication, IEEE Press, 1994, pp. 160–163.*

* cited by examiner

Primary Examiner—Alexander Markoff
(74) Attorney, Agent, or Firm—Silicon Valley Patent Group, LLP

(57) ABSTRACT

Provided is a method for removing etch byproducts inside a contact hole while minimizing lateral etching of the contact hole. After an etching process, a wafer having a contact hole is placed inside a plasma reaction chamber. The contact hole contains etch byproducts that may degrade the quality of electrical connections. A radio frequency (RF) source creates a RF field inside the reaction chamber. A gas mixture containing chemicals that are reactive with the etch byproducts is introduced into the reaction chamber. The gas mixture becomes ionized by the RF field and reacts with the etch byproducts in the contact hole, removing the etch byproducts. The gas mixture may include approximately 10–60 vol. % hydrogen gas, a gas that reacts with the etch byproducts (e.g., $NF_3$), and nitrogen. The hydrogen gas at least significantly reduces lateral etching of the contact hole by the reactive gas.

16 Claims, 3 Drawing Sheets

USING HYDROGEN GAS IN A POST-ETCH RADIO FREQUENCY-PLASMA CONTACT CLEANING PROCESS

FIELD OF THE INVENTION

This invention relates generally to the fabrication of microelectronic devices, and more particularly to cleaning a contact hole after etching.

BACKGROUND

Microelectronic device fabrication entails subjecting a substrate to various combinations of layering, patterning, doping, and heat treating processes to form electronic devices in and on the substrate. Out of the four categories of processes, the patterning process plays an especially important role in setting the critical dimension (CD) of the electronic devices. The patterning process entails removing selected portions of surface layers on a substrate. Thus, errors in the patterning process can cause distorted or misplaced patterns, which may in turn cause defects in the electrical functioning of the device or circuit. Likewise, contamination during the patterning process can introduce defects in the device and circuit.

During the patterning process, selected portions of a surface may be removed to form a contact hole. Different types of etching, such as conventional wet etching or dry etching, are commonly used to form the contact hole. Dry etching methods, such as a conventional plasma etching method, are typically preferred for semiconductor devices that require small CDs because they tend to result in more precise etching than conventional wet etching methods.

The etching process tends to leave photoresist residues, etch byproducts, and damaged silicon at the bottom of the contact hole. As some of the residues and byproducts are insulative, their presence in the contact hole can degrade the quality of electrical contact between circuit components and ultimately lead to device defects. One of the methods for removing the residues, byproducts, and damaged silicon inside a contact hole involves utilizing plasma (e.g., radio frequency (RF)—plasma, microwave plasma, or inductively coupled plasma) that includes fluorine. Fluorine is an etchant for the residues, byproducts, and damaged silicon. Unfortunately, exposing the contact hole to fluorine-containing plasma has an undesirable side effect of laterally etching the contact hole sidewall, thereby changing the CD and the shape of the contact hole. This side effect is experienced with many common sidewall materials such as spin-on-glass (SOG) and hydrogen silsesquioxane (HSQ), and is especially pronounced with doped silicon dioxide such as phosphosilicate glass (PSG), borophosphosilicate glass (BPSG), borosilicate glass (BSG), and borophospho tetraethyl orthosilicate (BPTEOS), the lattice structure of which is already disrupted by doping. This lateral etching side effect makes typical fluorine-plasma cleaning methods less than suitable for devices that are sensitive to changes in the critical dimension, such as devices having feature sizes below 0.25 microns. As feature sizes of electronic devices become smaller, the electronic devices become more sensitive to errors and contamination. Thus, as the feature sizes of electronic devices become smaller, there is a growing need for a method of cleaning a contact hole without lateral etching.

SUMMARY

The present invention allows removal of etch byproducts, residues, and damaged silicon inside a contact hole while minimizing lateral etching of the contact hole. The byproducts, residues, and damaged silicon are herein collectively referred to as "byproducts." The byproducts are removed through a chemical reaction wherein the reactive gases, such as fluorine in the form of RF plasma, are put in contact with the byproducts. During this reactive cleaning process, the reactants also come in contact with the sidewall of the contact hole and react with the sidewall material. Adding hydrogen gas to the RF plasma in accordance with the present invention allows the reactants to remove the byproducts and residues without laterally etching the contact hole sidewall. By minimizing lateral etching of the contact hole sidewall, the hydrogen gas reduces any changes to the shape and dimensions of the contact hole.

After an etching process, a wafer is mounted on a platen inside an RF plasma reaction chamber. The platen is coupled to an RF source. The reaction chamber is adjusted to an appropriate pressure (e.g., about 250–1000 mTorr), and a gas mixture is introduced into the chamber. The gas mixture may include approximately 10–60% hydrogen gas, a gas (e.g., $NF_3$) that removes the byproducts and residues, and nitrogen gas. The cleaning reaction is compatible with most conventional dry etching or a wet etching processes. The present invention may be used for any microelectronic devices for which maintenance of critical dimension plays an important role in preventing defects. The present invention is especially useful for devices having feature sizes less than 0.25 $\mu$m.

DETAILED DESCRIPTION

Figure 1A:
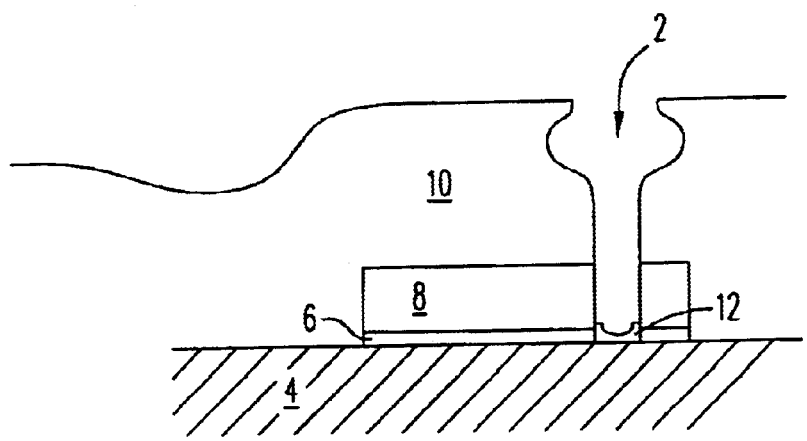
FIG. 1A, FIG. 1B, and FIG. 1C each depicts a cross sectional view of a vertical profile contact hole with a dielectric sidewall containing byproducts that need to be removed.
Figure 1B:
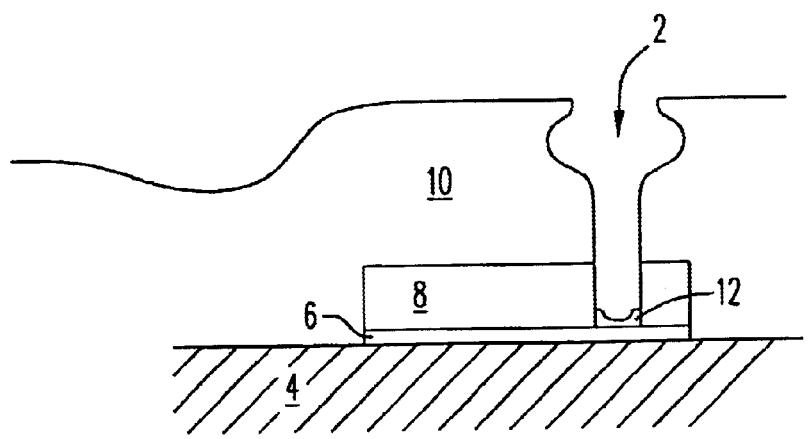
Figure 1C:
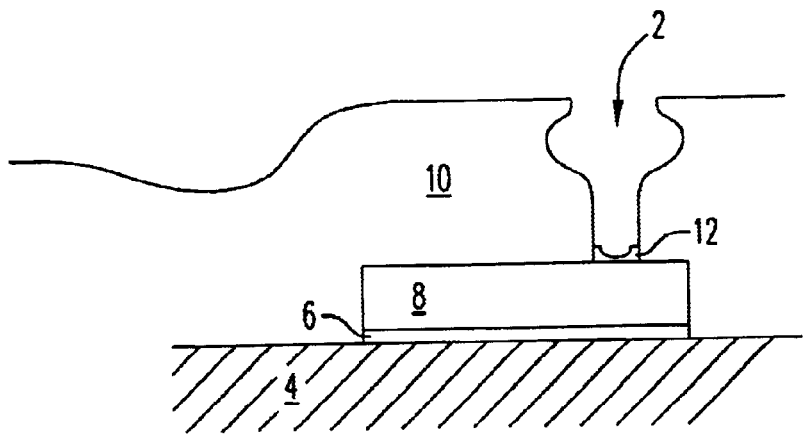

FIG. 1A through FIG. 1C depict a cross sectional view of layers of material deposited on a substrate 4. In each of FIG. 1A, FIG. 1B, and FIG. 1C, the layers include a gate oxide layer 6 adjacent to substrate 4, a polysilicon layer 8 deposited thereon, and a dielectric layer 10 on top of polysilicion layer 8. Dielectric layer 10 may include any conventional dielectric material used in semiconductor processing, such as HSQ, SOG, undoped silicon dioxide, BPSG, BSG, BPTEOS, or PSG. In addition to the layers, each of FIG. 1A, FIG. 1B, and FIG. 1C depicts a contact hole 2 with byproducts 12 inside. Byproducts 12, which refer to photoresist residues, etch byproducts, and damaged silicon, may include material such as tungsten, titanium, silicon, carbon, oxygen, hydrogen, nitrogen, fluorine, and other materials that may constitute the etched layers. Materials that constitute the etched layers include but are not limited to Mo, Ta, $WSi_2$, $MoSi_2$, $TiSi_2$, $TaSi_2$, Co, $CoSi_x$. Byproducts such as W and Ti may, for example, exist in a thin film on top of polysilicon layer 8.

FIG. 1A, FIG. 1B, and FIG. 1C demonstrate that the application of the present invention is not limited to contact holes of a particular location or depth. In FIG. 1A, contact hole 2 is etched through dielectric layer 10, polysilicon layer 8, and gate oxide layer 6, to the gate oxide-substrate interface. In FIG. 1B, contact hole 2 is etched through dielectric layer 10 and polysilicon layer 8, to the polysilicon-gate oxide interface. In FIG. 1C, contact hole 2 is etched only through dielectric layer 10 and extends to the interface of polysilicon layer 8 and dielectric layer 10. The present invention maybe applied to any contact hole in FIG. 1A, FIG. 1B, and FIG. 1C if the contact hole needs to be cleaned without changing the critical dimension. For example, the present method may be used with high density plasma (HDP)-etched contacts having an aspect ratio (ratio of depth to width) of at least 10:1, or with self-aligned contacts (SACs).

Figure 2:
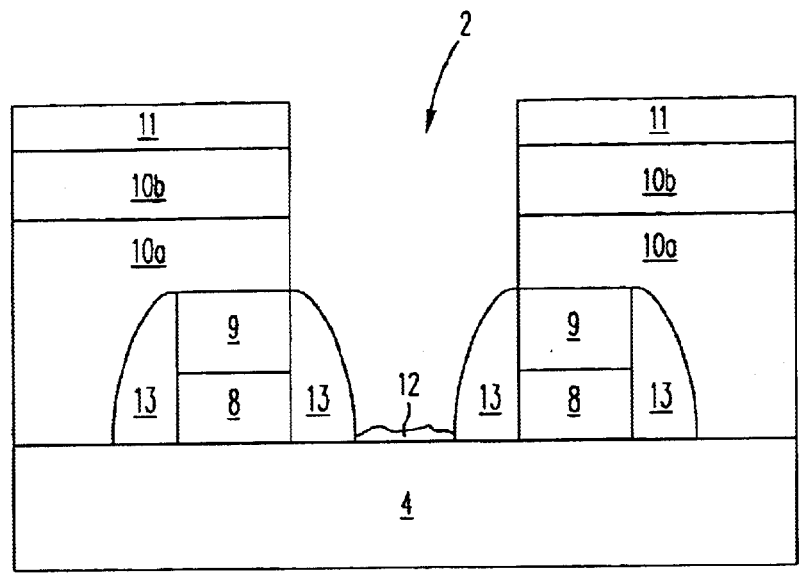
FIG. 2 depicts a cross sectional view of a self-aligned contact hole with a dielectric sidewall containing byproducts that need to be removed.

FIG. 2 depicts a cross section of one embodiment of a SAC containing byproducts 12 that need to be removed. The SAC includes contact hole 2 that extends through upper dielectric layer 10b, lower dielectric layers 10a, nitride layer 9, and polysilicon layer 8, to the surface of substrate 4. A gate oxide layer may be present between polysilicon layer 8 and substrate 4. In an exemplary embodiment, upper dielectric layer 10b may be a layer of tetraethyl orthosilicate (TEOS) or another form of silicon dioxide having a thickness of about 2,000–5,000 Å, and lower dielectric layer 10b may be a layer of phosphosilicate glass (PSG) having a thickness of about 4,000–10,000 Å. Width of contact hole 2 may be, for example, about 0.15–1.0 μm. FIG. 2 shows photoresist layer 11 deposited on top of upper dielectric layer 10b and spacers 13 formed around polysilicon layer 8 and nitride layer 9. In an exemplary embodiment, photoresist layer 11 may be about 2,000–10,000 Å thick and the two spacers 13 inside contact hole 2 may be separated by about 0.1–0.2 μm. Removing byproducts 12 in accordance with the present invention results in substantially zero lateral etching of dielectric layers 10a and 10b.

Figure 3:
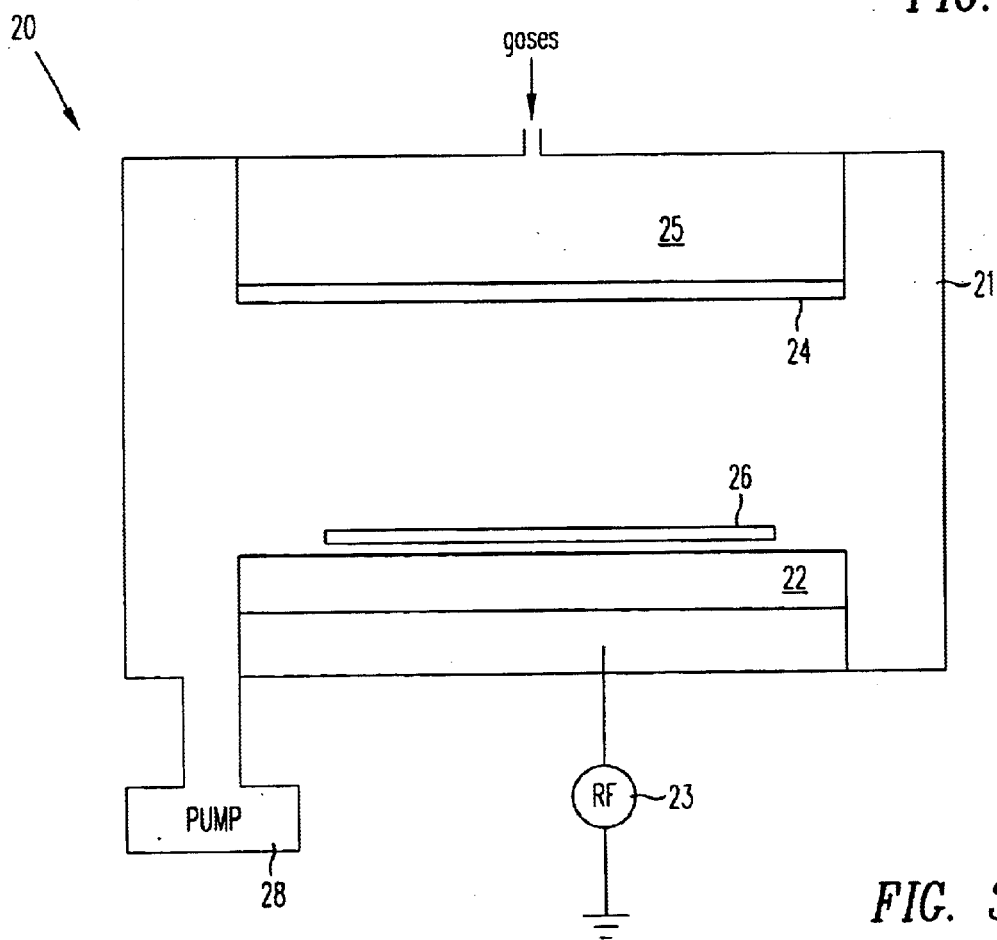
FIG. 3 depicts an exemplary radio frequency plasma reactor that may be used to implement the present invention.

FIG. 3 depicts an exemplary radio frequency (RF) plasma reactor 20 that may be used to implement the present invention. RF plasma reactor 20 includes a chamber 21, inside of which is a platen 22 that is coupled to an RF source 23. Also inside chamber 21 is a gas distribution plate 24 which is near a gas manifold 25 through which gases are introduced into chamber 21. RF source 23 creates an RF field inside chamber 21 so that the gases introduced into chamber 21 are ionized to form a plasma. When a wafer 26 is mounted on platen 22, the ions or radicals in the plasma react with parts of wafer 26 that need to be etched. The plasma might include $N_2$, $H_2$, and a fluorine source such as $NF_3$, $SF_6$, and $C_xH_yF_z$ wherein y could be zero. A vacuum pump 28 maintains a desired pressure level inside chamber 21. Optionally, a temperature control measure can be implemented for controlling the temperature of platen 22. Generally, apparatus such as RF plasma reactor 20 are well known in the art. PEP Iridia DL made by Novellus Systems is an example of an RF plasma reactor suitable for implementing the present invention.

Table 1 demonstrates that the presence of $H_2$ in the plasma increases the selectivity of thermal oxide ($T_{ox}$) over BPSG. "Selectivity," as used herein, refers to the ratio of the $T_{ox}$ etch rate to the BPSG etch rate obtained under substantially the same conditions. A person of ordinary skill in the art would know that in wet process chemistry, the removal of 15–75 Å of $T_{ox}$ is generally used as an approximation for a complete removal of etch byproducts. Based on this general approximation, a high selectivity of $T_{ox}$ over BPSG indicates a high selectivity of byproducts 12 over BPSG.

TABLE 1

Effect of Hydrogen Plasma on $T_{ox}$:BPSG Selectivity

| | | Control | $O_2$ Run | $H_2$ Run |
|---|---|---|---|---|
| row 1 | | | | |
| row 2 | Platen T (° C.) | 20 | 20 | 20 |
| row 3 | Wafer T (° C.) | 20 | 20 | 20 |
| row 4 | Pressure (mTorr) | 750 | 750 | 750 |
| row 5 | RF (W) | 480 | 400 | 480 |
| row 6 | $N_2$ (sccm) | 400 | 400 | 400 |
| row 7 | $H_2$ (sccm) | — | — | 300 |
| row 8 | $O_2$ (sccm) | — | 700 | — |
| row 9 | $NF_3$ (sccm) | 30 | 5 | 30 |
| row 10 | $T_{ox}$ ER (Å/min) | 680–1110 | | 755–857 |
| row 11 | BPSG ER (Å/min) | 1650–2600 | | 553–605 |
| row 12 | Selectivity | 0.4 | 0.7 | 1.25–1.55 |

*ER = etch rate; selectivity = $T_{ox}$ ER/BPSG ER

Table 1 shows the conditions and results of three separate runs designated as Control Run, $O_2$ Run, and $H_2$ Run. Data in rows 2–9 indicate experimental conditions for each run, and data in rows 10–12 represent the experimental results. As rows 2–4 indicate, a temperature of 20° C. was applied to platen 22 and a pressure of 750 mTorr was maintained inside chamber 21 for all three runs. The wafer is at thermal equilibrium with the platen it is mounted on. The Control Run included a supply of 400 standard cubic centimeters per minute (sccm) of nitrogen gas and 30 sccm of $NF_3$, but no oxygen or hydrogen. As shown in row 12, the resultant $T_{ox}$:BPSG selectivity of the Control Run is 0.4. Thus, in the absence of oxygen or hydrogen in the clean environment, BPSG is etched approximately twice as fast as $T_{ox}$.

The $O_2$ Run was conducted under substantially the same conditions as the Control Run, except 700 sccm of $O_2$ was supplied to chamber 21. The data in row 12 shows that the $T_{ox}$:BPSG selectivity in the presence of oxygen is 0.7. Compared to the Control Run where there is no supply of oxygen, the $O_2$ Run provides a slightly higher $T_{ox}$:BPSG selectivity, indicating that the etch rate of $T_{ox}$ is closer to the etch rate of BPSG when oxygen is present. However, in both cases, the $T_{ox}$:BPSG selectivities are lower than one, indicating that BPSG etches faster than $T_{ox}$. Based on the general approximation that the etch rate of $T_{ox}$ approximates the etch rate of byproducts (this approximation was mentioned above), devices cleaned with the Control Run or the $O_2$ Run would end up with a faster lateral etching of the BPSG sidewalls than the removal of byproducts 12. Thus, neither the Control Run nor the $O_2$ Run are suitable for cleaning devices that are sensitive to CD.

The $H_2$ Run was conducted under substantially the same conditions as the Control Run, except 300 sccm of $H_2$ was supplied to chamber 21. Data in row 12 indicates that the $T_{ox}$:BPSG selectivity with the particular plasma composition is 1.25–1.55, with an average value of 1.4. In contrast to the Control Run and the $O_2$ Run, the $H_2$ Run makes $T_{ox}$ etch faster than BPSG, as indicated by a selectivity ratio greater than 1. A comparison of the $T_{ox}$ etch rates (row 10) and the BPSG etch rates (row 11) of the Control Run and the $H_2$ Run reveals that the presence of $H_2$ lowers the etch rate of BPSG much more than it lowers the etch rate of $T_{ox}$. Specifically, the data in row 12 indicate that the presence of $H_2$ in the plasma can cause $T_{ox}$ to etch approximately 1.5 times faster than BPSG. Thus, adding $H_2$ to the plasma when cleaning contact hole 2 leads to removal of byproducts 12 with minimal lateral etching, allowing a contact hole to be cleaned without significantly changing the CD.

Further experiments show that a $T_{ox}$:BPSG selectivity greater than one is achieved under a range of conditions.

These conditions include: a platen temperature of about 5–40° C., a pressure of about 250–1000 mTorr, RF power of about 350–480 W, $N_2$ flow rate of about 200–500 sccm, $H_2$ flow rate of about 200–500 sccm, $NF_3$ flow rate of about 5–30 sccm, and process time of about 20–60 seconds. Under these conditions, the etch rates of $T_{ox}$ and BPSG are usually about 350–850 Å/min and about 300–600 Å/min, respectively. $T_{ox}$:BPSG selectivity ratio are 1–1.4. A higher selectivity ratio may be achieved by adjusting some of the experimental parameters, for example by increasing the process time. For example, in the $H_2$ Run shown in Table 1, a selectivity as high as 1.55 was achieved by increasing the process time to approximately 240 seconds.

Experiments also show that the experimental conditions provided above can be used to achieve a $T_{ox}$ selectivity greater than one for common sidewall materials other than BPSG. For example, the conditions that achieved a $T_{ox}$ etch rate of about 350–850 Å/min achieved etch rates of about 120–130 Å/min for nitride, about 100–300 Å/min for undoped polysilicon, and about 100–500 Å/min for a common photoresist material.

Table 2 compares the CD bias of a contact hole cleaned in the presence of $H_2$ gas against the CD bias of a contact hole cleaned without hydrogen gas. "CD," as used herein, refers to the width of a contact hole. "CD bias," as used herein, refers to the difference between the CD before RF-plasma cleaning and the CD after RF-plasma cleaning. Rows 2–8 provide experimental conditions, and rows 9–13 provide the results achieved after the contact holes were subjected to those experimental conditions for approximately 240 seconds. Control Run and $H_2$ Run are conducted under substantially the same experimental conditions, except that 400 sccm of $H_2$ gas was supplied only in the $H_2$ Run. Platen temperature and chamber pressure of 20° and 750 mTorr were used for both the Control Run and the $H_2$ Run, as in the Runs reported in Table 1. The percentage of hydrogen gas in the plasma was 0.41 in the Runs reported in Table 1, and this percentage is raised to 0.56 in the Runs in Table 2.

TABLE 2

Effect of Hydrogen Plasma on CD Bias

| row 1 | | Control Run | $H_2$ Run |
|---|---|---|---|
| row 2 | Platen T (° C.) | 20 | 20 |
| row 3 | Wafer T (° C.) | 20 | 20 |
| row 4 | Pressure (mTorr) | 750 | 750 |
| row 5 | RF (W) | 400 | 400 |
| row 6 | $N_2$ (sccm) | 300 | 300 |
| row 7 | $H_2$ (sccm) | — | 400 |
| row 8 | $NF_3$ (sccm) | 14 | 14 |
| row 9 | $T_{ox}$ ER (Å/min) | | 480 |
| row 10 | BPSG ER (Å/min) | | 380 |
| row 11 | Pre-Clean CD (μm) | 0.15 | 0.14 |
| row 12 | Post-Clean CD (μm) | 0.63 | 0.14 |
| row 13 | CD bias | 0.48 | 0 |

*CD bias = Pre-Clean CD (μ)-Post-Clean CD (μ)

Other experimental results not included herein indicate that a plasma containing between approximately 10% to approximately 60% by volume of hydrogen gas achieves a $T_{ox}$:BPSG selectivity greater than one. Experiments were generally conducted at hydrogen flowrates in the range of approximately 200 to approximately 500 sccm, $N_2$ flowrates in the range of approximately 200 to approximately 500 sccm, and $NF_3$ flowrates in the range of approximately 5 to approximately 30 sccm.

The experimental results in Table 2 indicate that adding hydrogen gas to the RF plasma prevents contact hole CD from being changed during the cleaning process. A CD bias greater than zero indicates that lateral etching occurred. The CD bias of the Control Run is 0.4, indicating a greater contact hole width after cleaning than before cleaning. In contrast, the $H_2$ Run achieved a CD bias of zero, indicating that lateral etching hardly occurred.

Figure 4A:
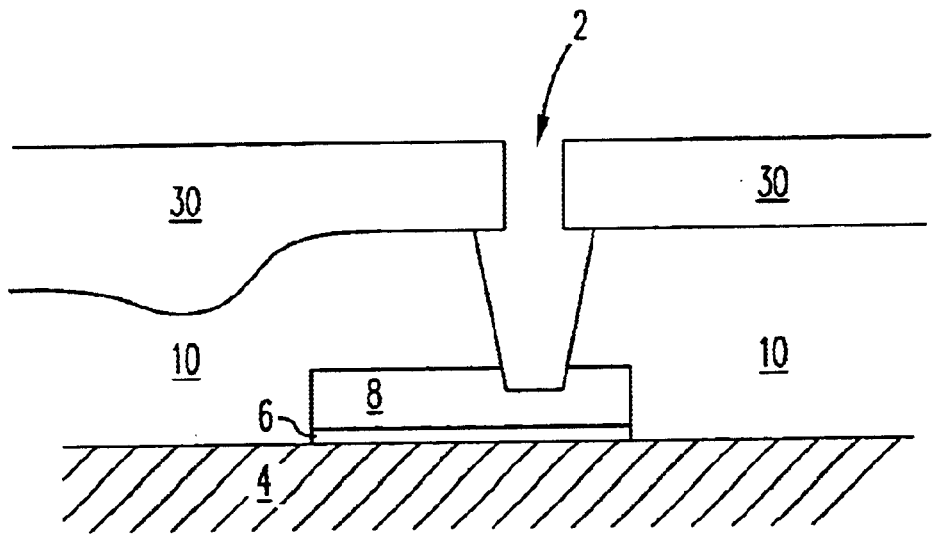
FIG. 4A depicts a crops sectional view of a contact hole which has been subjected to a radio frequency plasma clean process without hydrogen gas.
Figure 4B:
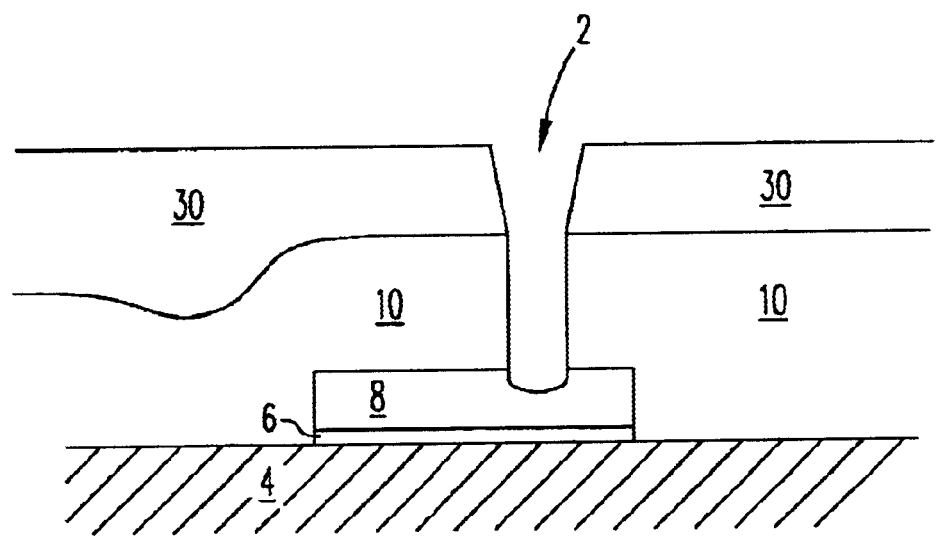
FIG. 4B depicts a cross sectional view of a contact bole which has been subjected to a radio frequency plasma clean process of the present invention.

FIG. 4A and FIG. 4B pictorially depict the results of the Control Run and the $H_2$ Run in Table 2. FIG. 4A depicts a contact hole that has been RF-plasma cleaned without $H_2$ in the plasma, and FIG. 4B depicts a contact hole that has been RF-plasma cleaned in the presence of $H_2$ gas. FIG. 4A and FIG. 4B each shows contact hole 2 etched through a photoresist layer 30 and dielectric layer 10, which may be a BPSG layer. FIG. 4A shows that lateral etching occurs during a conventional RF plasma clean process where no $H_2$ is supplied to chamber 21. Although there is no significant lateral etching in the photoresist layer, the CD of contact hole 2 in dielectric layer 10 is altered by lateral etching. According to Table 2, the lateral etching effect increased the width of contact hole 2 by approximately four times (from pre-clean CD of 0.15 μm to post-clean CD of 0.63 μm). In circuits that are sensitive to device CD, CD bias greater than 0.005 μm may cause shorting between conductive structures in the semiconductor device, for example between adjacent contacts. If the cleaning time is shortened to reduce the amount of lateral etching, byproducts 12 (FIG. 1A) will be less than completely removed, possibly resulting in device defects.

FIG. 4B indicates that adding $H_2$ to chamber 21 significantly reduces lateral etching. Table 2 indicates that when $H_2$ gas is present in chamber 21, RF plasma cleaning does not cause a change in the CD of contact hole. Without being bound to a theory of operation, the inventor speculates that $H_2$ molecules may adhere to BPSG more readily than to $T_{ox}$, effectively passivating the surfaces of the BPSG layer and causing $T_{ox}$ to etch at a higher rate than BPSG.

The cleaning process of the present invention may be carried out in situ, in the same chamber where etching took place. In that case, reaction conditions must be appropriately adjusted between the etching process and the cleaning process. Alternatively, the cleaning process of the present invention may be carried out using an apparatus that is entirely separate from where the etching was done.

While particular embodiments of the present invention have been shown and described, it will be obvious to those skilled in the art that modifications may be made without departing from the invention in its broader aspects. Therefore, the appended claims are to encompass within their scope all such modifications that fall within the true spirit and scope of this invention.

What is claimed is:

1. A method of cleaning byproducts from a semiconductor structure, said semiconductor structure comprising:
    a first layer consisting essentially of borophosphosilicate glass (BPSG) formed on top of a second layer consisting essentially of silicon, and
    a contact hole formed by etching through said first layer to said second layer, said byproducts being formed by said etching and being located in said contact hole, said byproducts comprising silicon-containing residues and damaged silicon; said method comprising:
    providing a reaction chamber, said reaction chamber comprising a platen;
    placing said structure on said platen;
    creating a plasma, said plasma comprising a gas mixture, said gas mixture comprising hydrogen gas and a fluorine gas; and
    causing said plasma to contact said byproducts.

2. The method of claim 1, wherein the depth of said contact hole is at least 10 times the width of said contact hole.

3. The method of claim 1, further comprising maintaining said platen at a temperature of about 5–40 degrees Celsius while said plasma is contacting said byproducts.

4. The method of claim 1, further comprising maintaining a pressure of about 250–1000 mTorr in said reaction chamber while said plasma is contacting said byproducts.

5. The method of claim 1, wherein said hydrogen gas retards the etch rate of said first layer more than said hydrogen retards the etch rate of said byproduct.

6. The method of claim 5, wherein an etch rate of said residues is from 1.25 to 1.55 times an etch rate of said first layer.

7. The method of claim 1, wherein said gas mixture comprises approximately 10% to approximately 60% hydrogen gas.

8. The method of claim 1, wherein said creating a plasma comprises delivering approximately 200 to approximately 500 sccm of hydrogen gas.

9. The method of claim 1, wherein said creating a plasma comprises delivering approximately 5 to approximately 30 sccm of $NF_3$ gas.

10. The method of claim 1, further comprising delivering $N_2$ to said chamber at approximately the same flowrate as hydrogen gas.

11. The method of claim 1, wherein said creating a plasma takes place in a radio frequency plasma reaction chamber.

12. The method of claim 11, wherein said radio frequency plasma reaction chamber comprises:
   a platen coupled to a radio frequency source that creates a radio frequency field inside said reaction chamber;
   a gas distribution plate through which gases are introduced into said reaction chamber to become ionized by said radio frequency field; and
   a vacuum pump for controlling the pressure inside said reaction chamber.

13. The method of claim 12, wherein said reaction chamber further comprises a means for controlling the temperature of said platen.

14. The method of claim 1, wherein said creating a plasma comprises introducing said hydrogen gas at a flowrate of about 200–500 sccm, introducing $NF_3$ at a flowrate of about 30 sccm, and introducing $N_2$ at a flowrate of about 200–500 sccm.

15. A method of cleaning byproducts from a semiconductor structure, said semiconductor structure comprising:
   a first layer formed on top of a second layer, said first layer consisting essentially of a material selected from the group consisting of phosphosilicate glass (PSG), borosilicate glass (BSG), borophosphosilicate glass (BPSG), and spin-on-glass, said second layer consisting essentially of silicon, and
   a contact hole formed by etching through said first layer to said second layer, said byproducts being formed by said etching and being located in said contact hole, said by products comprising silicon-containing residues and damaged silicon; said method comprising:
   providing a reaction chamber, said reaction chamber comprising a platen;
   placing said structure on said platen;
   creating a plasma, said plasma comprising a gas mixture, said gas mixture comprising hydrogen gas and a fluorine gas; and
   causing said plasma to contact said byproducts.

16. A method of cleaning byproducts from a semiconductor structure, said semiconductor structure comprising:
   a first layer consisting essentially of silicon nitride formed on top of a second layer consisting essentially of silicon,
   a third layer consisting essentially of borophosphosilicate glass (BPSG) formed on top of said first layer, and
   a contact hole formed by etching through said first and third layers to said second layer, said byproducts being formed by said etching and being located in said contact hole, said by products comprising silicon-containing residues and damaged silicon;
said method comprising:
   providing a reaction chamber, said reaction chamber comprising a platen;
   placing said structure on said platen;
   creating a plasma, said plasma comprising a gas mixture, said gas mixture comprising hydrogen gas and a fluorine gas; and
   causing said plasma to contact said byproducts.

* * * * *

UNITED STATES PATENT AND TRADEMARK OFFICE
CERTIFICATE OF CORRECTION

PATENT NO.     : 6,796,314 B1
DATED          : September 28, 2005
INVENTOR(S)    : Graff It is certified that error appears in the above-identified patent and that said Letters Patent is hereby corrected as shown below:

Column 5,
Line 8, add -- Typical values of -- before "Tox:BPSG".

Signed and Sealed this

Eleventh Day of October, 2005

JON W. DUDAS
*Director of the United States Patent and Trademark Office*